United States Patent
Wang

(10) Patent No.: US 10,177,763 B1
(45) Date of Patent: Jan. 8, 2019

(54) LEVEL SHIFT CIRCUIT CAPABLE OF REDUCING POWER CONSUMPTION

(71) Applicant: UNITED MICROELECTRONICS CORP., Hsin-Chu (TW)

(72) Inventor: Min-Chia Wang, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/877,368

(22) Filed: Jan. 22, 2018

(30) Foreign Application Priority Data

Dec. 20, 2017 (TW) .............................. 106144832 A

(51) Int. Cl.
  *H03K 19/00* (2006.01)
  *H03K 19/0185* (2006.01)
  *H03K 3/356* (2006.01)

(52) U.S. Cl.
  CPC ..... *H03K 19/0013* (2013.01); *H03K 3/35613* (2013.01); *H03K 3/356182* (2013.01); *H03K 19/018521* (2013.01)

(58) Field of Classification Search
  CPC ........... H03K 19/0013; H03K 3/35613; H03K 3/356182; H03K 19/018521
  See application file for complete search history.

(56) References Cited

U.S. PATENT DOCUMENTS

| | | | |
|---|---|---|---|
| 6,480,050 B1 | 11/2002 | Barnes | |
| 7,839,198 B2 * | 11/2010 | Nakamura | H03K 3/35613 326/63 |
| 8,581,627 B2 | 11/2013 | Panov | |
| 8,653,877 B2 | 2/2014 | Wu | |
| 2006/0220696 A1 * | 10/2006 | Katou | H03K 3/35613 327/100 |

* cited by examiner

*Primary Examiner* — Daniel D Chang
(74) *Attorney, Agent, or Firm* — Winston Hsu

(57) ABSTRACT

A level shift circuit receives an first input logic signal and a second input logic signal, and generates a first output logic signal and a second output logic signal. The level shift circuit includes a first current mirror module, a second current mirror module, and a latch module. The first current mirror module and the second current mirror module respectively output a first control logic signal having a phase performance following the first input logic signal and a second control logic signal having a phase performance following the second input logic signal. The latch module is coupled to the first current mirror module and the second current mirror module. The latch module receives the first control logic signal and the second control logic signal, and updates correspondingly and stores the output logic signal and the complementary output logic signal.

20 Claims, 3 Drawing Sheets

US 10,177,763 B1

LEVEL SHIFT CIRCUIT CAPABLE OF REDUCING POWER CONSUMPTION

BACKGROUND OF THE INVENTION

1. Field of the Invention

This invention is related to a level shift circuit, and more particularly, to a level shift circuit capable of reducing power consumption.

2. Description of the Prior Art

Generally, to operate a circuit efficiently while meeting the requirement for power consumption, circuits of different functions may be designed to have different operation voltages. When one circuit is coupled to another, or to control another, a level shift circuit would be needed to shift the voltage of the operation signal outputted from one circuit to meet the requirement of another circuit so another circuit can receive the signal and function normally.

In prior art, the level shift circuit usually pulls down the output signal to a low voltage level through an N-type transistor and pulls up the output signal to a high voltage level through a P-type transistor. However, when the voltage level of the output signal changes as the voltage level of the input signal, the N-type transistor and the P-type transistor of the level shift circuit are usually turned on during the same period of time. In this case, to ensure the voltage level of the output signal can be updated correctly, an N-type transistor with a large area would be chosen for implementation. Therefore, when the two transistors are both turned on, the N-type transistor will drive a greater current, pulling down the voltage level of the output signal. However, during this process, the level shift circuit will produce a significant leakage current, resulting in great power consumption. In addition, to drive a greater current, the user also has to choose N-type transistors with large areas. For example, the area of the N-type transistor can be twenty times larger than the P-type transistor. Therefore, the overall area of the level shift circuit is difficult to be reduced.

SUMMARY OF THE INVENTION

One embodiment of the preset invention discloses a level shift circuit for receiving a first input logic signal and a second input logic signal, and generating a first output logic signal and a second output logic signal. The level shift circuit includes a first current mirror module, a second current mirror module, and a latch module.

The first current mirror module receives the first input logic signal and the second output logic signal, and outputs a first control logic signal having a phase performance following the first input logic signal. The second current mirror module receives the second input logic signal and the first output logic signal, and outputs a second control logic signal having a phase performance following the second input logic signal. The latch module is coupled to the first current mirror module and the second current mirror module. The latch module receives the first control logic signal and the second control logic signal, correspondingly updates and stores the first output logic signal and the second output logic signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
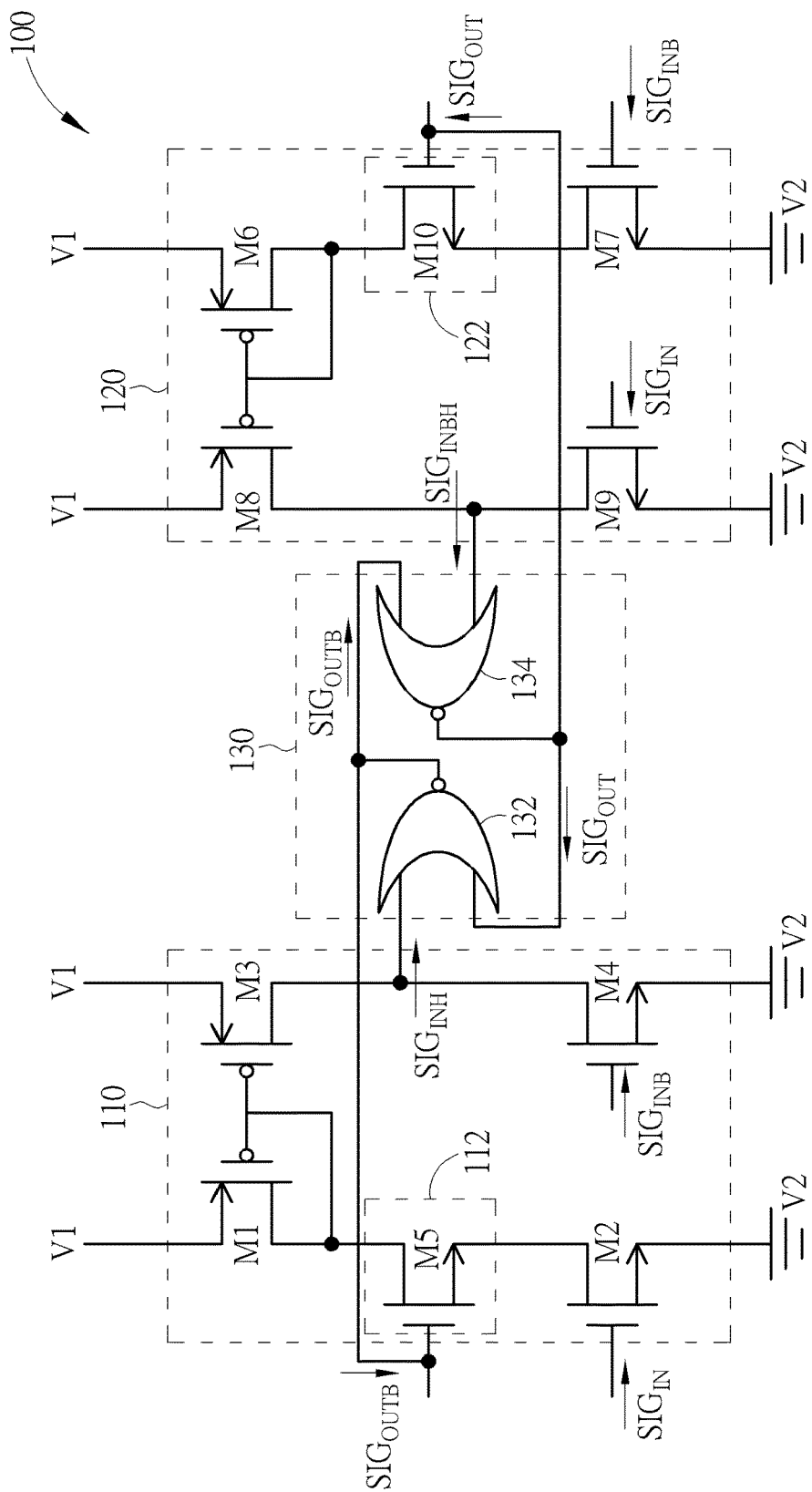
FIG. 1 shows a level shift circuit according to one embodiment of the present invention.

FIG. 1 shows a level shift circuit 100 according to one embodiment of the present invention. The level shift circuit 100 includes a first current mirror module 110, a second current mirror module 120, and a latch module 130.

The level shift circuit 100 can receive a first input logic signal $SIG_{IN}$ and a second input logic signal $SIG_{INB}$, and generate a first output logic signal $SIG_{OUT}$ and a second output logic signal $SIG_{OUTB}$. In some embodiments, the first input logic signal $SIG_{IN}$ and the second input logic signal $SIG_{INB}$ are two complementary logic signals switching between a first high voltage level VH1 and a first low voltage level VL1. Also, the first output logic signal $SIG_{OUT}$ and the second output logic signal $SIG_{OUTB}$ are two complementary logic signals switching between a second high voltage level VH2 and a second low voltage level VL2. In addition, the first output logic signal $SIG_{OUT}$ has a phase performance following the first input logic signal $SIG_{IN}$, and the second output logic signal $SIG_{OUTB}$ has a phase performance following the second input logic signal $SIG_{INB}$.

The first current mirror module 110 can receive the first input logic signal $SIG_{IN}$ and the second output logic signal $SIG_{OUTB}$, and output a first control logic signal $SIG_{INH}$ having a phase performance following the first input logic signal $SIG_{IN}$. Also, the first current mirror module 110 can include a first switch 112. The first switch 112 can be disposed on a reference current path of the first current mirror module 110, and can activate the first current mirror module 110 according to the second output logic signal $SIG_{OUTB}$.

For example, the first current mirror module 110 can include a first transistor M1, a second transistor M2, a third transistor M3, and a fourth transistor M4.

The first transistor M1 has a first terminal, a second terminal, and a control terminal. The first terminal of the first transistor M1 can receive the first system voltage V1, the second terminal of the first transistor M1 is coupled to the first switch 112, and the control terminal of the first transistor M1 is coupled to the second terminal of the first transistor M1. The second transistor M2 has a first terminal, a second terminal, and a control terminal. The first terminal of the second transistor M2 is coupled to the first switch 112, the second terminal of the second transistor M2 can receive the second system voltage V2, and the control terminal of the second transistor M2 can receive the first input logic signal $SIG_{IN}$.

The third transistor M3 has a first terminal, a second terminal, and a control terminal. The first terminal of the third transistor M3 can receive a first system voltage V1, the second terminal of the third transistor M3 can output the first control logic signal $SIG_{INH}$, and the control terminal of the third transistor M3 is coupled to the control terminal of the first transistor M1. The fourth transistor M4 has a first terminal, a second terminal, and a control terminal. The first terminal of the fourth transistor M4 is coupled to the second terminal of the third transistor M3, the second terminal of the fourth transistor M4 can receive the second system voltage V2, and the control terminal of the fourth transistor can receive the second input logic signal $SIG_{INB}$.

In FIG. 1, the first switch 112 can include a fifth transistor M5. The fifth transistor M5 has a first terminal, a second terminal, and a control terminal. The first terminal of the fifth transistor M5 is coupled to the second terminal of the first transistor M1, the second terminal of the fifth transistor M5 is coupled to the first terminal of the second transistor M2, and the control terminal of the fifth transistor M5 can receive the second output logic signal $SIG_{OUTB}$. Since the first switch 112 is disposed between the first transistor M1 and the second transistor M2. That is, the first switch 112 is disposed on the reference current path of the first current mirror module 110. Therefore, by operating the first switch 112, the first current mirror module 110 can be activated or deactivated for controlling the power consumption efficiently.

The second current mirror module 120 and the first current mirror module 110 have similar structures. The second current mirror module 120 can receive the second input logic signal $SIG_{INB}$ and the first output logic signal $SIG_{OUT}$, and output a second control logic signal $SIG_{INBH}$ having a phase performance following the second input logic signal $SIG_{INB}$. In addition, the second current mirror module 120 can include a second switch 122. The second switch 122 can be disposed on a reference current path of the second current mirror module 120, and can activate the second current mirror module 120 according to the first output logic signal $SIG_{OUT}$.

For example, the second current mirror module 120 can include a sixth transistor, a seventh transistor, an eighth transistor M8, and a ninth transistor M9.

The sixth transistor M6 has a first terminal, a second terminal, and a control terminal. The first terminal of the sixth transistor M6 can receive the first system voltage V1, the second terminal of the sixth transistor M6 is coupled to the second switch 122, and the control terminal of the sixth transistor M6 is coupled to the second terminal of the sixth transistor M6. The seventh transistor M7 has a first terminal, a second terminal, and a control terminal. The first terminal of the seventh transistor M7 is coupled to the second transistor 122, the second terminal of the seventh transistor M7 can receive the second system voltage V2, and the control terminal of the seventh transistor M7 can receive the second input logic signal $SIG_{INB}$.

The eighth transistor M8 has a first terminal, a second terminal, and a control terminal. The first terminal of the eighth transistor M8 can receive the first system voltage V1, the second terminal of the eighth transistor M8 can output the second control logic signal $SIG_{INBH}$, and the control terminal of the eighth transistor M8 is coupled to the control terminal of the sixth transistor M6. The ninth transistor M9 has a first terminal, a second terminal, and a control terminal. The first terminal of the ninth transistor M9 is coupled to the second terminal of the eighth transistor M8, the second terminal of the ninth transistor M9 can receive the second system voltage V2, and the control terminal of the ninth transistor M9 can receive the first input logic signal $SIG_{IN}$.

Also, the second switch 122 can include a tenth transistor M10 having a first terminal, a second terminal, and a control terminal. The first terminal of the tenth transistor M10 is coupled to the second terminal of the sixth transistor M6, the second terminal of the tenth transistor M10 is coupled to the first terminal of the seventh transistor M7, and the control terminal of the tenth transistor M10 can receive the first output logic signal $SIG_{OUT}$.

In some embodiments, the first system voltage V1 can be higher than the second system voltage V2. The first system voltage V1 can be, for example, the operation voltage in the system for providing the second high voltage level VH2. The second system voltage V2 can be, for example, the ground voltage of the system for providing the second low voltage level VL2. In this case, the first transistor M1, the third transistor M3, the sixth transistor M6, and the eighth transistor M8 can be P-type transistors, and the second transistor M2, the fourth transistor M4, the fifth transistor M5, the seventh transistor M7, the ninth transistor M9, and the tenth transistor M10 can be N-type transistors.

The latch module 130 is coupled to the first current mirror module 110 and the second current mirror module 120. The latch module 130 can receive the first control logic signal $SIG_{INH}$ and the second control logic signal $SIG_{INBH}$, correspondingly update and store the first output logic signal $SIG_{OUT}$ and the second output logic signal $SIG_{OUTB}$ so that the first output logic signal $SIG_{OUT}$ will have a phase performance following the first control logic signal $SIG_{INH}$ while the second output logic signal $SIG_{OUTB}$ will have a phase performance following the second input logic signal $SIG_{INBH}$.

The latch module 130 can include a first NOR gate 132 and a second NOR gate 134. The first NOR gate 132 and the second NOR gate 134 can be cross-coupled. For example, the first NOR gate 132 can have a first input terminal for receiving the first control logic signal $SIG_{INH}$, a second input terminal for receiving the first output logic signal $SIG_{OUT}$, and an output terminal for outputting the second output logic signal $SIG_{OUTB}$. Also, the second NOR gate 134 can have a first input terminal for receiving the second control logic signal $SIG_{INBH}$, a second input terminal for receiving the second output logic signal $SIG_{OUTB}$, and an output terminal for outputting the first output logic signal $SIG_{OUT}$.

Figure 2:
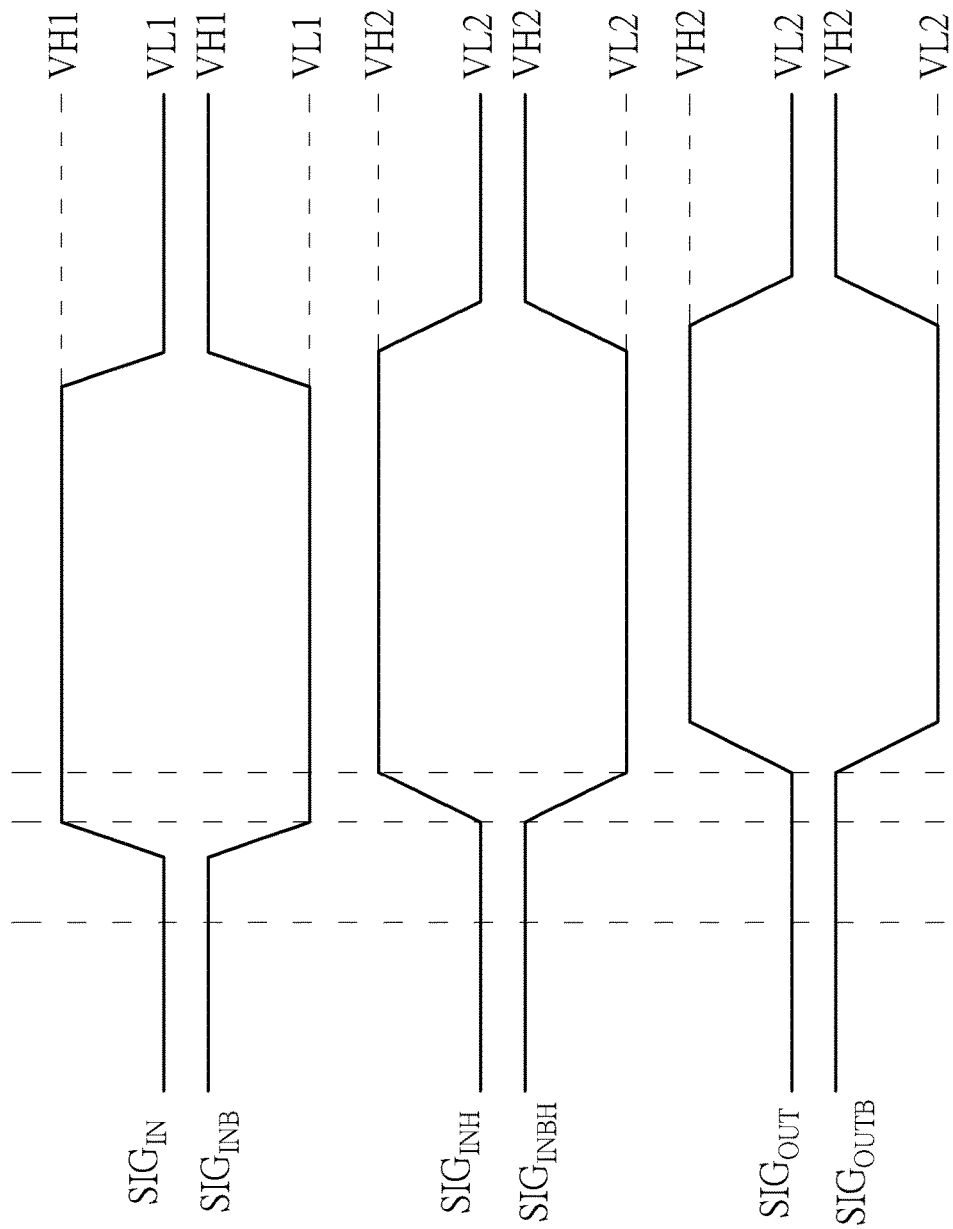
FIG. 2 shows a signal waveform diagram of the level shift circuit in FIG. 1 according to one embodiment of the present invention.

FIG. 2 shows a signal waveform diagram of the level shift circuit 100 according to one embodiment of the present invention. In FIG. 2, the first low voltage level VL1 and the second low voltage level VL2 can be the same reference voltage level, for example but not limited to, the ground voltage level. In addition, the second high voltage level VH2 can be higher than the first high voltage level VH1. For example, the first high voltage level VH1 can be 0.7V, and the second high voltage level VH2 can be 1.8V.

In FIG. 2, at the first time point T1, the level shift circuit 100 is in a stable state. At this moment, the first input logic signal $SIG_{IN}$ is at the first low voltage level VL1, the second input logic signal $SIG_{INB}$ is at the first high voltage level VH1. The first output logic signal $SIG_{OUT}$ is at the second low voltage level VL2, and the second output logic signal $SIG_{OUTB}$ is at the second high voltage level VH2.

In this case, the second transistor M2 of the first current mirror module 110 can be turned off so the first current mirror module 110 will not generate currents even with the fifth transistor M5 of the first switch 112 receiving the second output logic signal $SIG_{OUTB}$ at the second high voltage level VH2. Also, although the seventh transistor M7 of the second current mirror module 120 can receive the second input logic signal $SIG_{INB}$ at the first high voltage level VH1, the second current mirror module 120 will not generate currents due to the tenth transistor M10 of the second switch 122 being turned off by receiving the first output logic signal $SIG_{OUT}$ at the second low voltage level VL2. That is, the level shift circuit 100 will not generate currents in the stable state, reducing power consumption.

At the time point T2, the first input logic signal $SIG_{IN}$ changes from the first low voltage level VL1 to the first high voltage level VH1 while the second input logic signal $SIG_{INB}$ changes from the first high voltage level VH1 to the first low voltage level VL1. In this case, since the first output logic signal $SIG_{OUT}$ and the second output logic signal $SIG_{OUTB}$ are not updated initially, the first output logic signal $SIG_{OUT}$ will remain at the second low voltage level VL2, and the second output logic signal $SIG_{OUTB}$ will remain at the second high voltage level VH2. That is, the second transistor M2 and the fifth transistor M5 on the reference current path of the first current mirror module 110 are turned on so the first current mirror module 110 is activated to generate the reference current. However, in this time, the fourth transistor M4 can be turned off so the copied current generated accordingly by the third transistor M3 will raise the voltage level of the first control logic signal $SIG_{INH}$ rapidly. Furthermore, since the second current mirror module 120 is not activated yet, the ninth transistor M9 being turned on in the second current mirror module 120 will pull down the voltage level of the second control logic signal $SIG_{INBH}$ to the second low voltage level VL2 rapidly.

When the first control logic signal $SIG_{INH}$ is raised to the second high voltage level VH2 at the time point T3, the latch module 130 will be activated. In this case, the first NOR gate 132 will change the output voltage level so the second output logic signal $SIG_{OUTB}$ will be pulled down to the second low voltage level VL2. When the second output logic signal $SIG_{OUTB}$ is pulled down to the second low voltage level VL2, the first switch 112 is turned off, stopping the first current mirror module 110 from generating currents. In addition, the second NOR gate 134 will also changes its output voltage level, and raise the voltage level of the first output logic signal $SIG_{OUT}$ to the second high voltage level VH2. Consequently, the level shift circuit 100 can update the first output logic signal $SIG_{OUT}$ and the second output logic signal $SIG_{OUTB}$ as the first input logic signal $SIG_{IN}$ and the second input logic signal $SIG_{INB}$ change, and enter to the next stable state.

Similarly, in the case when the first input logic signal $SIG_{IN}$ changes from the first high voltage level VH1 to the first low voltage level VL1 and the second input logic signal $SIG_{INB}$ changes from the first low voltage level VL1 to the first high voltage level VH1, the second current mirror module 120 will be activated to pull up the voltage level of the second control logic signal $SIG_{INBH}$ while the first current mirror module 110 will not be activated, pulling down the voltage level of the first control logic signal $SIG_{INH}$ rapidly. Consequently, the latch 130 will be triggered and update the first output logic signal $SIG_{OUT}$ and the second output logic signal $SIG_{OUTB}$ accordingly.

In other words, in the level shift circuit 100, the first current mirror module 110 and the second current mirror module 120 will be activated at different time periods. Therefore, the issue of large leakage currents caused by the N-type transistors and the P-type transistors being turned on at the same time in the prior art can be prevented in the level shift circuit 100, that is, the leakage current can be reduced. Furthermore, without competing with the P-type transistor, the large current requirement for the N-type transistor is not necessary anymore. Therefore, it is not necessary to choose N-type transistors with greater areas. Instead, the N-type transistors may have a similar size as the P-type transistors. Consequently, the area of the level shift circuit 100 can be reduced significantly. In some embodiments, the area of the level shift circuit 100 can be reduced to 60% comparing to the level shift circuit in prior art.

In addition, the first current mirror module 110 and the second current mirror module 120 shown in FIG. 1 may also be implemented in a different way. That is, in some embodiments, the first current mirror module 110 and the second current mirror module 120 may use other current mirror structures for implementation according to the system requirement.

Figure 3:
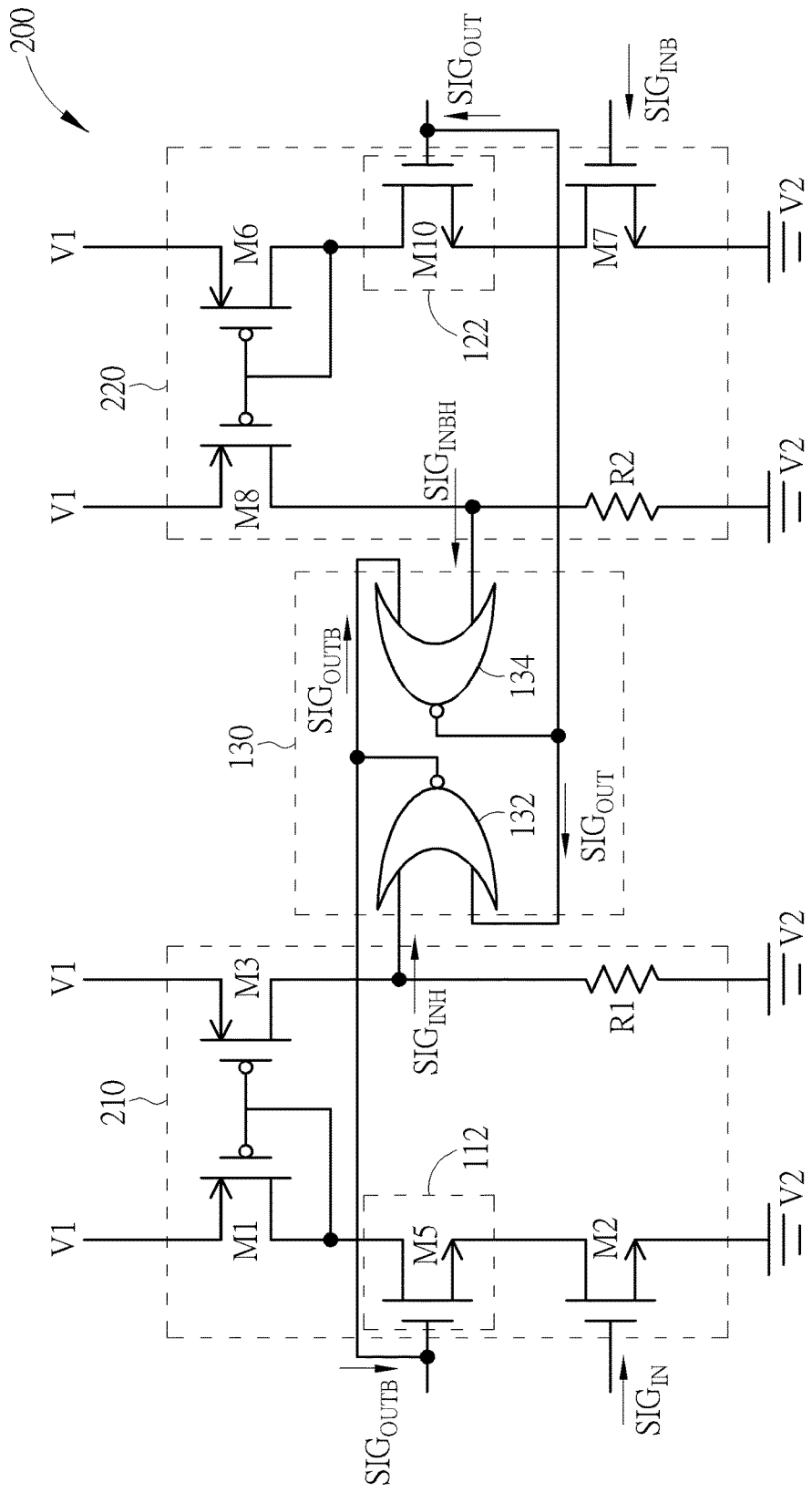
FIG. 3 shows a level shift circuit according to another embodiment of the present invention.

FIG. 3 shows a level shift circuit 200 according to another embodiment of the present invention. The level shift circuit 200 and the level shift circuit 100 have similar structures and operation principles. However, in the level shift circuit 200, the first current mirror module 210 can use a first resistor R1 to replace the fourth transistor M4 in the first current mirror module 110. Also, the second current mirror module 220 can use a second resistor R2 to replace the ninth transistor M9 in the second current mirror module 120

The first resistor R1 has a first terminal and a second terminal. The first terminal of the first resistor R1 is coupled to the second terminal of the third transistor M3, and the second terminal of the first resistor R1 can receive the second system voltage V2. The second resistor R2 has a first terminal and a second terminal. The first terminal of the second resistor R2 is coupled to the second terminal of the eighth transistor M8, and the second terminal of the second resistor R2 can receive the second system voltage V2.

The level shift circuit 200 can be operated with the same waveform shown in FIG. 2. In this case, when the first current mirror module 210 is activated at the time point T2, the copied current generated by the third transistor M3 will flow through the first resistor R1. In this case, by properly selecting the resistance of the first resistor R1, the voltage level of the first control logic signal $SIG_{INH}$ can still be raised to the second high voltage level VH2. In contrast, since the second current mirror module 220 is not activated, the second resistor R2 can also be used to pull down the second control logic signal $SIG_{INBH}$ to the second low voltage level VL2.

In addition, since the first switch 112 will be turned off when the level shift circuit 200 enters the stable state, stopping the first current mirror module 210 from generating currents, the additional power consumption caused by the first resistor R1 would be insignificant.

Since the first current mirror module 210 and the second current mirror module 220 of the level shift circuit 200 will be activated during different time periods, the issue of prior art caused by the competition between the turned-on N-type transistors and the turned-on P-type transistors can be prevented, reducing the leakage currents. In addition, since the large current requirement for the N-type transistors is no longer necessary, the N-type transistors can be implemented with a smaller area, reducing the total area of the level shift circuit 200 significantly.

In summary, the level shift circuits provided by the embodiments of the present invention can use the current mirror modules with switches to update the voltage level of signals. Therefore, the power consumption can be controlled efficiently. Also, since the N-type transistors and the P-type transistors in the level shift circuits of the present invention will not be turned on at the same time for competition, the leakage current can be reduced. Also, the N-type transistors can be implemented with a smaller area, reducing the total area of the level shift circuit significantly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A level shift circuit configured to receive a first input logic signal and a second input logic signal, and generate a first output logic signal and a second output logic signal, and comprising:
   a first current mirror module configured to receive the first input logic signal and the second output logic signal, and output a first control logic signal having a phase performance following the first input logic signal;
   a second current mirror module configured to receive the second input logic signal and the first output logic signal, and output a second control logic signal having a phase performance following the second input logic signal; and
   a latch module coupled to the first current mirror module and the second current mirror module, and configured to receive the first control logic signal and the second control logic signal, update correspondingly and store the first output logic signal and the second output logic signal, the latch module comprising a first NOR gate and a second NOR gate, and the first NOR gate and the second NOR gate being cross-coupled.

2. The level shift circuit of claim 1, wherein:
   the first input logic signal and the second input logic signal are two complementary logic signals switching between a first high voltage level and a first low voltage level; and
   the first output logic signal and the second output logic signal are two complementary logic signals switching between a second high voltage level and a second low voltage level.

3. The level shift circuit of claim 2, wherein the second high voltage level is higher than the first high voltage level.

4. The level shift circuit of claim 1, wherein the first current mirror module and the second current mirror module are activated at different periods.

5. The level shift circuit of claim 1, wherein:
   when the first input logic signal changes from a first low voltage level to a first high voltage level and the second input logic signal changes from the first high voltage level to the first low voltage level, the second output logic signal is kept at a second high voltage level initially so as to activate the first current mirror module and pull up the first control logic signal to the second high voltage level; and
   when the first control logic signal is raised to the second high voltage level, the latch module is triggered and pulls down the second output logic signal to a second low voltage level.

6. The level shift circuit of claim 5, wherein:
   when the second output logic signal is pulled down to the second low voltage level, the latch module is triggered and pulls up the first output logic signal to the second high voltage level.

7. The level shift circuit of claim 1, wherein:
   the first NOR gate has a first input terminal configured to receive the first control logic signal, a second input terminal configured to receive the first output logic signal, and an output terminal configured to output the second output logic signal; and
   the second NOR gate has a first input terminal configured to receive the second control logic signal, a second input terminal configured to receive the second output logic signal, and an output terminal configured to output the first output logic signal.

8. The level shift circuit of claim 1, wherein:
   the first current mirror module comprises a first switch disposed on a reference current path of the first current mirror module, and configured to activate the first current mirror module according to the second output logic signal; and
   the second current mirror module comprises a second switch disposed on a reference current path of the second current mirror module, and configured to activate the second current mirror module according to the first output logic signal.

9. The level shift circuit of claim 8, wherein the first current mirror module comprises:
   a first transistor having a first terminal configured to receive a first system voltage, a second terminal coupled to the first switch, and a control terminal coupled to the second terminal of the first transistor;
   a second transistor having a first terminal coupled to the first switch, a second terminal configured to receive a second system voltage, and a control terminal configured to receive the first input logic signal; and
   a third transistor having a first terminal configured to receive the first system voltage, a second terminal configured to output the first control logic signal, and a control terminal coupled to the control terminal of the first transistor.

10. The level shift circuit of claim 9, wherein the first current mirror module further comprises:
    a fourth transistor having a first terminal coupled to the second terminal of the third transistor, a second terminal configured to receive the second system voltage, and a control terminal configured to receive the second input logic signal.

11. The level shift circuit of claim 10, wherein:
    the first system voltage is greater than the second system voltage;
    the first transistor and the third transistor are P-type transistors; and
    the second transistor and the fourth transistor are N-type transistors.

12. The level shift circuit of claim 9, wherein the first switch comprises a fifth transistor having a first terminal coupled to the second terminal of the first transistor, a second terminal coupled to the first terminal of the second transistor, and a control terminal configured to receive the second output logic signal.

13. The level shift circuit of claim 12, wherein the fifth transistor is an N-type transistor.

14. The level shift circuit of claim 8, wherein the second current mirror module comprises:
    a sixth transistor having a first terminal configured to receive a first system voltage, a second terminal coupled to the second switch, and a control terminal coupled to the second terminal of the sixth transistor;
    a seventh transistor having a first terminal coupled to the second switch, a second terminal configured to receive a second system voltage, and a control terminal configured to receive the second input logic signal; and
    an eighth transistor having a first terminal configured to receive the first system voltage, a second terminal configured to output the second control logic signal, and a control terminal coupled to the control terminal of the sixth transistor.

15. The level shift circuit of claim 14, wherein the second current mirror module further comprises:

a ninth transistor having a first terminal coupled to the second terminal of the eighth transistor, a second terminal configured to receive the second system voltage, and a control terminal configured to receive the first input logic signal.

16. The level shift circuit of claim 15, wherein:
the first system voltage is greater than the second system voltage;
the sixth transistor and the eighth transistor are P-type transistors; and
the seventh transistor and the ninth transistor are N-type transistors.

17. The level shift circuit of claim 14, wherein the second switch comprises a tenth transistor having a first terminal coupled to the second terminal of the sixth transistor, a second terminal coupled to the first terminal of the seventh transistor, and a control terminal configured to receive the first output logic signal.

18. The level shift circuit of claim 17, wherein the tenth transistor is an N-type transistor.

19. A level shift circuit configured to receive a first input logic signal and a second input logic signal, and generate a first output logic signal and a second output logic signal, and comprising:
a first current mirror module configured to receive the first input logic signal and the second output logic signal, and output a first control logic signal having a phase performance following the first input logic signal;
a second current mirror module configured to receive the second input logic signal and the first output logic signal, and output a second control logic signal having a phase performance following the second input logic signal; and
a latch module coupled to the first current mirror module and the second current mirror module, and configured to receive the first control logic signal and the second control logic signal, update correspondingly and store the first output logic signal and the second output logic signal;
wherein:
the first current mirror module comprises:
a first switch disposed on a reference current path of the first current mirror module, and configured to activate the first current mirror module according to the second output logic signal;
a first transistor having a first terminal configured to receive a first system voltage, a second terminal coupled to the first switch, and a control terminal coupled to the second terminal of the first transistor;
a second transistor having a first terminal coupled to the first switch, a second terminal configured to receive a second system voltage, and a control terminal configured to receive the first input logic signal;
a third transistor having a first terminal configured to receive the first system voltage, a second terminal configured to output the first control logic signal, and a control terminal coupled to the control terminal of the first transistor; and a first resistor having a first terminal coupled to the second terminal of the third transistor, and a second terminal configured to receive the second system voltage; and
the second current mirror module comprises a second switch disposed on a reference current path of the second current mirror module, and configured to activate the second current mirror module according to the first output logic signal.

20. A level shift circuit configured to receive a first input logic signal and a second input logic signal, and generate a first output logic signal and a second output logic signal, and comprising:
a first current mirror module configured to receive the first input logic signal and the second output logic signal, and output a first control logic signal having a phase performance following the first input logic signal;
a second current mirror module configured to receive the second input logic signal and the first output logic signal, and output a second control logic signal having a phase performance following the second input logic signal; and
a latch module coupled to the first current mirror module and the second current mirror module, and configured to receive the first control logic signal and the second control logic signal, update correspondingly and store the first output logic signal and the second output logic signal;
wherein:
the first current mirror module comprises a first switch disposed on a reference current path of the first current mirror module, and configured to activate the first current mirror module according to the second output logic signal; and
the second current mirror module comprises:
a second switch disposed on a reference current path of the second current mirror module, and configured to activate the second current mirror module according to the first output logic signal;
a sixth transistor having a first terminal configured to receive a first system voltage, a second terminal coupled to the second switch, and a control terminal coupled to the second terminal of the sixth transistor;
a seventh transistor having a first terminal coupled to the second switch, a second terminal configured to receive a second system voltage, and a control terminal configured to receive the second input logic signal;
an eighth transistor having a first terminal configured to receive the first system voltage, a second terminal configured to output the second control logic signal, and a control terminal coupled to the control terminal of the sixth transistor; and
a second resistor having a first terminal coupled to the second terminal of the eighth transistor, and a second terminal configured to receive the second system voltage.

* * * * *